(12) United States Patent
Fang et al.

(10) Patent No.: US 7,116,174 B2
(45) Date of Patent: Oct. 3, 2006

(54) BASE CURRENT COMPENSATION CIRCUIT FOR A BIPOLAR JUNCTION TRANSISTOR

(75) Inventors: Hao Fang, Savage, MN (US); Cameron Carroll Rabe, Inver Grove Heights, MN (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/953,897

(22) Filed: Sep. 29, 2004

(65) Prior Publication Data

US 2006/0066408 A1    Mar. 30, 2006

(51) Int. Cl.
*G06F 1/04* (2006.01)
*H03K 3/00* (2006.01)

(52) U.S. Cl. .................. 330/296; 330/129; 330/130; 330/138; 330/261; 330/257; 327/108; 327/478; 327/589

(58) Field of Classification Search ............... 330/296, 330/129, 261, 130, 257, 138; 327/108, 478, 327/589
See application file for complete search history.

(56) References Cited

U.S. PATENT DOCUMENTS

| 3,967,207 | A |  | 6/1976 | Wheatley, Jr. |
| 6,710,649 | B1 | * | 3/2004 | Matsumoto et al. .... 330/124 R |
| 6,965,267 | B1 | * | 11/2005 | Delorme et al. ............ 330/257 |

* cited by examiner

*Primary Examiner*—Michael B. Shingleton

(57) ABSTRACT

A method and apparatus for compensating a base current of a bipolar junction transistor by replicating operating conditions of the BJT in a compensating circuit. An output current of the compensating circuit is fractionally related to the base current and thus can be supplied to an operational circuit comprising the BJT to compensate the base current. In a preferred embodiment, the BJT is operated between BVCEO and BVCBO and the base current to be compensated flows from the BJT.

36 Claims, 4 Drawing Sheets

BASE CURRENT COMPENSATION CIRCUIT FOR A BIPOLAR JUNCTION TRANSISTOR

FIELD OF THE INVENTION

The present invention relates generally to bipolar junction transistors and more specifically to an apparatus and method providing base current compensation for bipolar junction transistors.

BACKGROUND OF THE INVENTION

A bipolar junction transistor (BJT) comprises three adjacent doped semiconductor regions or layers having an NPN or PNP doping configuration. A middle region forms a base and two end regions form an emitter and a collector. Typically, the emitter has a higher dopant concentration than the base and the collector, and the base has a higher dopant concentration than the collector. Generally, the BJT can be operated as an amplifier (for example, to amplify an input signal supplied between the base and the emitter, with the output signal appearing across the emitter/collector) or as a switch (for example, an input signal applied across the base/emitter switches the emitter/collector circuit to an opened or a closed (i.e., short-circuited) state). In operation, the emitter/base pn junction is forward biased and the collector/base pn junction is reverse biased. According to convention, all BJT currents are assumed to be positive when flowing into the base, collector and emitter regions of the BJT.

The breakdown characteristics of a BJT are determined by its physical parameters, including doping levels and region dimensions. The reverse-biased base-collector junction is susceptible to avalanche breakdown, during which a carrier of the reverse saturation current falls down a potential barrier at the reverse-biased junction and acquires energy from the applied potential across the junction. For example, in an isolated pn junction, if the reverse bias voltage creates a sufficiently large electric field in the transition region, an electron of the reverse saturation current entering from the p-type material may acquire sufficient kinetic energy to cause an ionizing collision with the lattice, creating an electron-hole pair. The original electron and the secondary electron are swept into the n-material by the electric field, and the secondary hole is swept to the p-side. The generated secondary carriers (both the electron and the hole) may acquire sufficient energy from the applied field, collide with another crystal ion, and create still another electron-hole pair. Each new carrier may, in turn, produce additional carriers through collision and disruption of existing bonds. The cumulative process is referred to as avalanche multiplication, where an initial carrier can create a large number of new carriers. Increasing the reverse bias voltage increases the energy imparted to the carrier, in turn increasing the rate at which additional carriers are generated by collisions, i.e., increasing the avalanche multiplication factor.

In a common base configuration with the emitter open, the breakdown due to impact ionization produces a breakdown voltage (BVCBO) (referred to as the common base breakdown voltage with the emitter open) above which the collector current increases without bound and is essentially limited by the external circuit resistance, i.e., the circuit in which the transistor is operative. This breakdown phenomenon is essentially identical to the breakdown of an isolated pn junction as described above. With the emitter current set at zero (because the emitter is open) transistor action plays no role in this breakdown mechanism. The value BVCBO thus represents an upper operational limit for the collector-base reverse-bias voltage of a transistor. Since the sum of the collector-base voltage and the base-emitter voltage equals the collector-emitter voltage and the base-emitter voltage is constant, BVCBO can also be regarded as an upper limit on the collector-emitter voltage.

For the common emitter configuration with the base open, avalanche breakdown occurs at a voltage BVCEO (referred to as the common emitter breakdown voltage with the base open), where BVCEO<BVCBO due to the influence of transistor action on the avalanche multiplication process.

In the BJT, during avalanche breakdown carriers generated by impact ionization in the collector-base depletion region are injected into the base or swept into the collector. The carriers injected into the base create a base current that in turn leads to an increase in the emitter current that in turn increases the carriers injected from the emitter. A current runaway situation may eventually develop as the avalanche mechanism snowballs. The current of injected carriers is multiplied by the avalanche multiplication factor at operating voltages well below BVCEO, and as BVCEO is approached breakdown of the base-collector junction is observed, i.e., the collector current increases without bound.

For example, in an NPN transistor, if the reverse bias voltage is sufficiently large, electrons collected in the collector may collide with a crystal ion in the collector depletion region, imparting sufficient energy to disrupt a crystal bond and create an electron-hole pair by impact ionization. The initial and secondary electrons are swept into the collector, while the secondary hole is swept into the base by the junction field. The generated carriers may acquire sufficient energy from the applied field, collide with another crystal ion, and create still another electron-hole pair. Each new carrier may, in turn, produce additional electron-hole pairs through collision and disruption of existing bonds.

To maintain charge neutrality in the NPN base, as holes flow into the base from the collector, additional electrons must be supplied to the base by the emitter. But the increase in electron injection causes an increase in the injection of electrons from the base into the collector that leads to the generation of additional secondary carriers at the base-collector depletion region. Thus transistor action contributes to the avalanche condition.

In a case where the emitter-base junction is slightly reverse-biased by imposing a small negative base current, the transistor can be operated above BVCEO as the negative base current minimizes carrier injection from the emitter into the base, minimizing the effect of transistor action on the avalanche condition and permitting operation of the transistor at a voltage above BVCEO (but not above BVCBO). Due to the negative base current, the emitter junction initially does not inject electrons into the base region. But, as the multiplication process increases hole injection into the base region to a point where the additional flow of holes into the base exceeds the negative base current, the holes flow into the emitter region. When hole injection into the emitter junction has increased sufficiently to cause significant electron injection into the base region, transistor action again begins to influence the avalanche process. An identical operating condition arises for a PNP bipolar junction transistor, with the references to holes and electrons reversed.

If the base current is positive or zero and the transistor is operated with a collector-base voltage above BVCEO, the avalanche process aided by transistor action causes the transistor to break down. However, if the base terminal can sink all the negative base current created during the avalanche multiplication process, the avalanche process does not cause a breakdown condition, unless the collector-base voltage is above BVCBO. Since in a typical bipolar junction transistor, BVCEO is much less than BVCBO, the transistor can be operated in the region between BVCEO and BVCBO if the base can sink the negative base current. In some transistor applications it may be necessary to compensate this negative base current to avoid errors in the transistor's output voltage.

In a typical bipolar junction transistor, the collector breakdown voltage (BVCEO) and the collector carrier transit time depend upon the thickness and doping concentration of the base and collector region. Lighter doping and a wider collector region increase the breakdown voltage and collector transit time. A narrower base decreases transit time (permitting operation at higher frequencies) but a higher collector-emitter voltage can destroy the narrow base. Ideally, transistors having both a high breakdown voltage and high speed performance flow transit time) are desired. Optimizing a bipolar junction transistor relative to these two countervailing effects necessarily results in a tradeoff between breakdown voltage and transit time (or speed, which is directly related to the maximum operational frequency for the transistor). A typical integrated circuit includes transistors that are optimized for high voltage operation and also transistors that are optimized for high speed performance, rather than attempting to produce a single transistor structure that is optimized for both.

BRIEF SUMMARY OF THE INVENTION

According to one embodiment, the present invention comprises a method for compensating base current of a BJT operating in an operational circuit, further comprising, replicating operating conditions of the BJT in a compensating circuit, producing a compensating current in the compensating circuit, wherein the compensating current is related to the base current and supplying the compensating current to the operational circuit to compensate the base current of the BJT.

The invention further comprises an apparatus for producing a compensating base current of an operational BJT operating in an operational circuit and having an operating base current. The apparatus comprises a compensating BJT having substantially similar operating parameters to the operational BJT, a first plurality of circuit elements replicating operating conditions of the operational circuit and a second plurality of circuit elements operational with the first plurality of circuit elements and the compensating BJT for producing the compensating base current, wherein the compensating current is supplied to the operational circuit to compensate the operating base current.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

DETAILED DESCRIPTION OF THE INVENTION

Before describing in detail the particular method and apparatus for base current compensation according to the present invention, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the invention.

According to the teachings of the present invention, a positive or a negative BJT base current can be compensated. For example, when a BJT is connected in a common collector (emitter follower) configuration and is operated with a collector-base voltage above BVCEO but below BVCBO, if the transistor circuit can sink the resulting negative base current created by the avalanche condition, breakdown of the transistor can be avoided. However, the negative base current that can significantly affect the output voltage Vout. As is known, the output voltage is intended to be a function of the collector and emitter currents. A compensation circuit of the present invention compensates the base current (either positive or negative) for a collector-base voltage above or below BVCEO to minimize or limit the effect of the base current on the BJT output voltage or another BJT operating parameter.

As described above, the BJT breakdown voltage BVCEO and operational speed are inversely related. If a high speed BJT is desired, the breakdown voltage BVCEO may be undesirably low, leading to avalanche conditions when the collector-base voltage exceeds BVCEO. However, if the BJT base current is compensated (and the base region has the capacity to sink the base current) as taught by the present invention, operation under avalanche conditions, i.e., in the region between BVCEO and BVCBO is acceptable. A BJT exhibiting high speed performance with a relatively low BVCEO can then be effectively utilized, notwithstanding the low BVCEO value.

Figure 1:
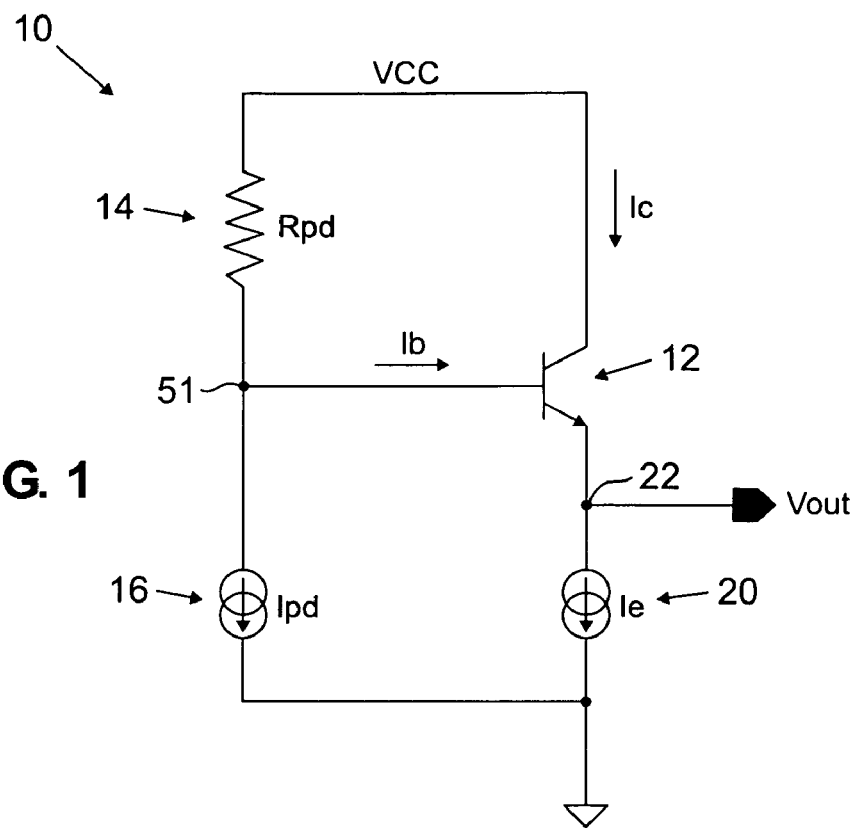
FIG. 1 illustrates a BJT in a common-collector mode of operation.

FIG. 1 illustrates a conventional output driver 10 comprising a BJT 12 connected in a common collector (emitter follower) configuration. One application for the BJT 12 operating as an emitter follower comprises a preamplifier for a read/write head of a disk drive storage device. Specifically, an output voltage of the BJT drives a transmission line that is connected to the write head. The BJT supplies write current over the transmission line for writing data to the storage device according to known techniques.

A resistor Rpd 14 and a current source Ipd 16 are connected between a supply voltage Vcc and ground. A current source Ie 20 is connected between an output terminal 22 and ground. An output voltage at the output terminal 22 is designated Vout. The output voltage is determined from Vout=Vcc−Ipd*Rpd−Vbe. Due to the presence of base current, albeit small during normal transistor operation, the output voltage is more accurately given by Vout=Vcc−(Ipd+Ib)*Rpd−Vbe. In emitter follower applications where it is desired to maintain an accurate output voltage, a relatively large Ib value should be avoided. Also, for a BJT operated between BVCEO and BVCBO, i.e., in the region of avalanche conditions, the base current can be substantial (and negative, that is, flowing out of the base terminal for an NPN transistor). The output voltage therefore exhibits a strong dependence on the base current. The present invention compensates the base current to remove the dependence of the output voltage on the base current.

In one application comprising a disk drive storage system, the current source Ipd is controlled by data values to be written to a magnetic disk of the disk drive storage system. The current Ipd is switched between two values Ipd1, representing a "1" bit, and Ipd2 representing a "0" bit. Thus Vout switches between two voltages for supplying current to a write head of the disc drive storage system. The supplied current causes the write head to assume a positive state to write a '1' bit to the magnetic disc, or a negative state to write a '0' bit to the magnetic disc.

There are known base current compensation circuits, such as alpha compensation circuits capable of compensating only a positive base current to limit base current effects on the output voltage. According to the alpha compensation technique the positive base current is made to flow through a source-drain current path of a first MOSFET, which is mirrored to a parallel second MOSFET. The current flow through the second MOSFET, which is the positive base current, is directed to an output terminal for use in compensating the positive base current.

Figure 2:
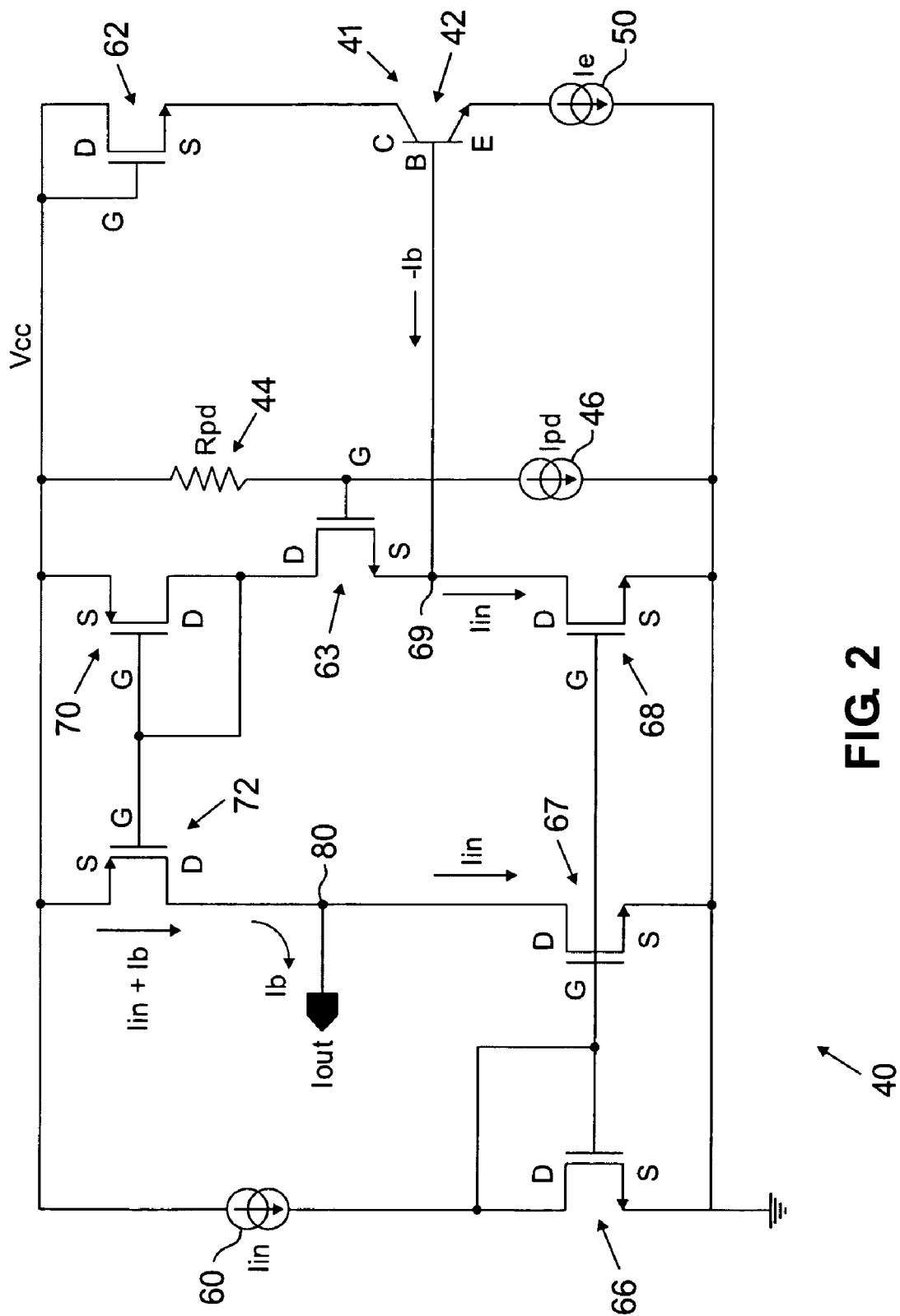
FIG. 2 illustrates a base current compensation circuit for the common-collector BJT configuration of FIG. 1, according to the teachings of the present invention.

FIG. 2 illustrates a base current compensation circuit 40 according to the teachings of the present invention for producing an output current Iout related to the base current (whether the base current is positive or negative) generated by a BJT. As described above, a negative base current is produced when the BJT is operating in an avalanche condition. The current Iout is supplied to the operating BJT to cancel the effects of the base current (i.e., compensate the base current) on the output voltage Vout. Removing the effects of a negative base current on the output voltage permits operation of the transistor above BVCEO.

The base current compensation circuit 40 comprises an emitter follower 41 that mimics or replicates operating conditions of the emitter follower 10 in FIG. 1. That is, the emitter follower 41 comprises a BJT 42, a resistor Rpd 44, and current sources Ipd 46 and Ie 50 having values and characteristics substantially equivalent to the corresponding BJT 12, the resistor Rpd 14 and the current sources Ipd 16 and Ie 20. In another embodiment, the emitter follower 41 comprises a scaled version of the emitter follower 10 wherein one or more of the elements of the emitter follower 41 are scaled versions of the corresponding element of the emitter follower 10. The output current from the base current compensation circuit 40 is scaled by a scale factor to generate a compensating base current of the emitter follower 10.

The output current Iout produced by the base current compensation circuit 40 is equal to the base current of the emitter follower of FIG. 1, i.e., Iout=Ib, where Iout is positive when current flows out of an output terminal 80. Since Iout=Ib, Iout can be used to compensate the base current (whether flowing into or from the base) of the emitter follower 10. For example, Iout is supplied to the terminal 51 of the emitter follower of FIG. 1 to compensate a negative base current −Ib that is produced during the avalanche condition. To compensate −Ib flowing from the base terminal of the BJT 12, Iout is input to the terminal 51 such that the current through the resistor Rpd 14 is Ipd. In another embodiment, the output current Iout controls the current source Ipd 16, according to known techniques, to compensate the base current, i.e., the current produced by the current source Ipd 16 is adjusted to compensate for Ib such that the current through Rpd 14 is Ipd.

A current source Iin 60 in FIG. 2 is sized to accommodate the worse case beta for the emitter follower 10 under avalanche conditions for the BJT 12, wherein Iin=Ie/(−worst case beta), since this condition generates the maximum base current in the transistor 12. A typical worst case beta can be between about −40 and −10. A MOSFET 68 is selected to sink the negative base current under these worse case conditions. Also, the base region of the BJT 42 must be capable of sinking the worst case base current.

For the base current compensation circuit 40 to accurately replicate operating conditions of the emitter follower 10 and produce the compensation current, it is necessary for the BJT 42 to exhibit a base-collector voltage substantially identical to the base-collector voltage of the BJT 12 in FIG. 1. A voltage on a collector C of the BJT 42 equals the supply voltage Vcc minus a diode voltage drop across a gate-source junction (G-S) of a MOSFET 62. A voltage on a base B of the BJT 42 equals the voltage drop across the resistor Rpd 44 and a gate-source junction (G-S) of a MOSFET 63. Thus, since a diode voltage drop is present in both the collector and base circuits of the BJT 42, these two voltage drops cancel, and the base-collector voltage of the BJT 42 is identical to the base-collector voltage of the BJT 12 in FIG. 1, i.e., the voltage drop across the resistor Rpd 44/14. Also, the emitter current of the BJT 12 is substantially identical to the emitter current of he BJT 42. Since the base current of the BJT 42 is substantially dependent on the base-collector voltage and the emitter current, the base current of the BJT 42 is substantially identical to the base current of the BJT 12 (or a scaled current as described above). As is known by those skilled in the art, other effects on the base current are relatively insignificant and are not considered according to a preferred embodiment of the present invention.

Current from the current source Iin 60 flows through a drain-source current path (D-S) of a MOSFET 66 and is mirrored such that the same current flows through a drain-source current path (D-S) of the MOSFET 67 and through a drain-source current path (D-S) of a MOSFET 68. Although MOSFET current mirrors are used according to one embodiment of the present invention, it is known by those skilled in the art that other current mirror implementations can be substituted for the current mirrors as illustrated in FIG. 2. As is further known, a current mirror connected to the positive voltage supply (Vcc) typically comprises either a PMOSFET or an PNP transistor. Current mirrors connected to the negative supply voltage or ground typically comprise either an NMOSFET or an NPN transistor. Such conventions are known in the art, but are not intended to be limiting features of the present invention as other techniques and structures can be used to generate the current mirrors of the present invention.

The current Iin flows from a node 69 into the drain-source current path of the MOSFET 68. A negative base current (−Ib) flows into the node 69. Since a drain-source current path (D-S) of a MOSFET 70 is connected to the node 69 via a drain-source current path (D-S) of the MOSFET 63, the current through the drain-source path of the MOSFET 70 equals the current Iin+Ib, based on the Kirchoff's current law that the current flowing into a junction (such as the node 69) equals the current flowing from the junction.

The current flow (Iin+Ib) through the MOSFET 70 is mirrored to a source-drain path (D-S) of a MOSFET 72. The difference current between the MOSFET 67 and the MOSFET 72 is the base current of the BJT 42 (Ib), which flows out of the output terminal 80.

The output current Iout=Ib is added to the current source Ipd 16 (or used to appropriately control the current source Ipd as described above) in FIG. 1. The output voltage from the FIG. 1 emitter follower is:

$$Vcc-(Ipd+Iout-Ib)*Rpd-Vbe=Vcc-Ipd*Rpd-Vbe.$$

Thus the output voltage has been made independent of the base current as desired.

The teachings of the present invention can also be employed to compensate a positive base current in an application where a BJT produces positive base current that affects the output voltage or another operational parameter. The compensated positive base current is generated according to the base current compensation circuit 40 and supplied to the node 51 or used to control the current source Ipd 50 to effectuate the base current compensation.

The teachings of the present invention can be extended to a BJT operating in a common emitter or a common base configuration. For a common emitter circuit, the emitter voltage is fixed, and for a common base circuit the base voltage is fixed. But since the base emitter junction voltage is relatively fixed at a diode voltage drop, fixing either the base or the emitter voltage effectively fixes the other voltage. In both configurations, the output voltage depends on the output current and the load resistance, or Vout=Vcc−Ic*RL. The output current is established by accurately setting the collector-base voltage or the emitter current, and the collector current Ic equals to −Ie-Ib. Thus Vout=Vcc−(−Ie-Ib)*RL. The compensation circuit of the present invention can be employed to compensate the base current and remove the base current effect on the output voltage in either the common base or the common emitter configuration.

Figure 3:
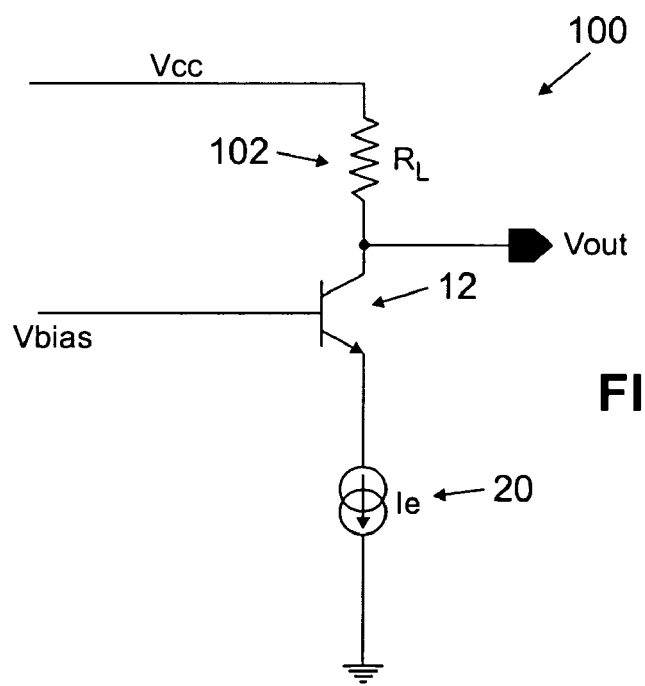
FIG. 3 illustrates a BJT in a common-emitter mode of operation.

A conventional common emitter circuit 100 is illustrated in FIG. 3, including a load resistor RL102. The base of the common emitter circuit 100 is biased according to known techniques. The collector emitter circuit 100 produces an output voltage Vout that is responsive to the output current through the load resistor 102 and the resistance of the load resistor.

Figure 4:
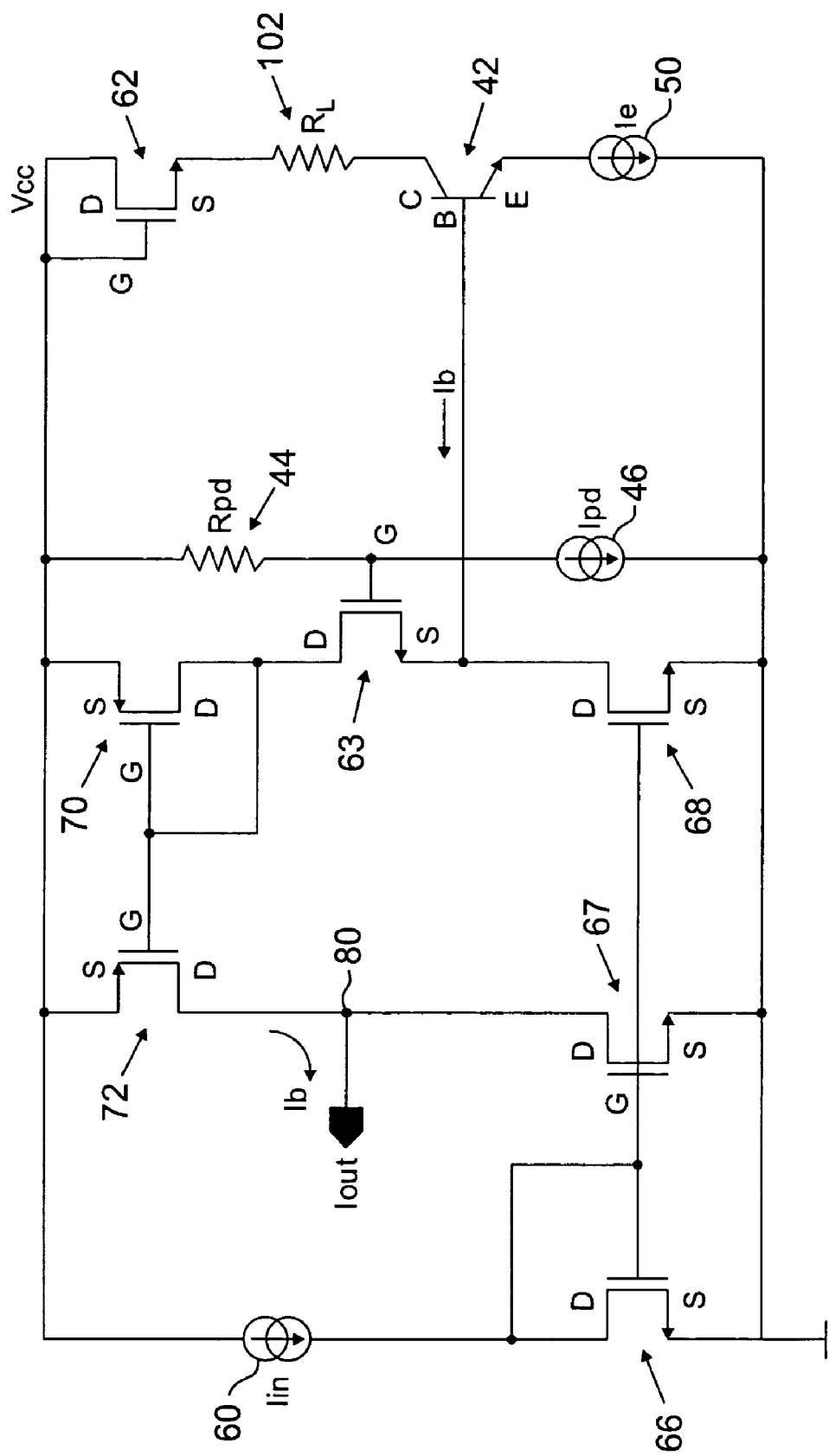
FIG. 4 illustrates a base current compensation circuit for the common-emitter BJT configuration of FIG. 3, according to the teachings of the present invention

FIG. 4 illustrates a base current compensation circuit 110 for compensating the base current of the common emitter circuit 100 of FIG. 3. The compensation circuit 110 operates like the base current compensation circuit 40, generating a base current Iout=Ib.

Figure 5:
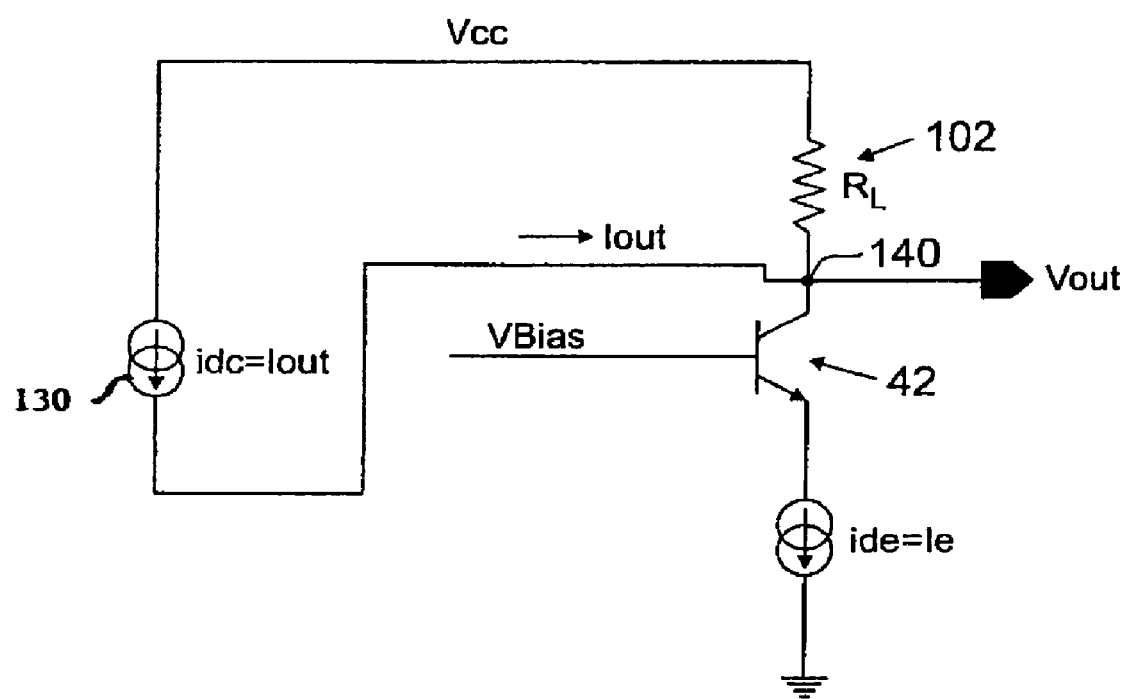
FIG. 5 illustrates a circuit for supplying the compensation current produced by the base current compensation circuit of FIG. 4 to the common-emitter BJT circuit of FIG. 3.

FIG. 5 illustrates a circuit for supplying the current Iout=Ib to the common emitter circuit 100 to compensate the base current. As shown, a current source Iout 130 provides the compensation current Iout=Ib from the base current compensation circuit 110. The current Iout is supplied to a node 140. By establishing Iout=Ib by operation of the base current compensation circuit 110, and supplying Iout to the collector of the BJT 12 in FIG. 5, the influence of the base current on the output voltage is removed. The base compensation circuit 110 provides compensation current for either a positive or a negative base current.

The various current sources described in conjunction with the embodiments of the present invention can be implemented as current sources or as current mirrors that mirror a reference current supplied from an external source.

The compensating current produced according to various embodiments of the present invention is related to the base current of the BJT as an equivalent, inverse, multiple or fraction. Thus supplying the compensating current to the BJT to compensate the BJT base current is achieved according to the relationship between the compensating current and the base current.

An architecture and process have been described as useful for compensating a base current for BJT connected as an emitter follower. Specific applications and exemplary embodiments of the invention that provide a basis for practicing the invention in a variety of ways and in a variety of circuit structures have been illustrated and discussed. Numerous variations are possible within the scope of the invention. Features and elements associated with one or more of the described embodiments are not to be construed as required elements for all embodiments. The invention is limited only by the claims that follow.

What is claimed is:

1. A method for compensating base current of a BJT producing an output voltage and operating in an operational circuit, comprising:

replicating operating conditions of the BJT in a replica circuit of the operational circuit, wherein the replica circuit has a replica BJT with a replica base current supplied by a compensating circuit;

producing a compensating current in the compensating circuit to allow operation of the BJT in a BJT breakdown region, wherein the compensating current is related to the replica base current; and supplying the compensating current to an output voltage terminal of the operational circuit to compensate the influence of the base current of the BJT on the output voltage.

2. The method of claim 1 wherein the base current comprises negative base current, and wherein the BJT is operating in the BJT breakdown region between a common emitter breakdown voltage with the base open (BVCEO and a common base breakdown voltage with emitter open (BVGBO).

3. The method of claim 1 wherein the base current flows through a load resistor of the operational circuit thereby affecting an output voltage of the operational circuit, and wherein the step of supplying the compensating current removes the effect of the base current on the output voltage.

4. The method of claim 1 wherein the operating conditions of the BJT comprise a collector-base voltage and an emitter current of the BJT.

5. The method of claim 1 wherein the compensating current is substantially equal in magnitude to the base current.

6. The method of claim 1 wherein the compensating current is fractionally related to the base current.

7. The method of claim 1 wherein the operational circuit comprises one of a common emitter circuit, a common base circuit, and a common collector circuit.

8. A method for compensating a base current of a BJT, comprising:

providing an input current on a first segment of a serial current path, wherein the current path further comprises a second segment and a node disposed between the first and the second segments;

producing a replicated base current; and causing a combination of the replicated base current and the input current to flow through the second segment of the current path, wherein an output voltage at the node is compensated by the base current influence on the output voltage to allow peration of the BJT in a BJT breakdown region.

9. The method of claim 8 wherein the output current is equal in magnitude to the base current.

10. The method of claim 8 wherein the output current is a fractional multiple of the base current.

11. The method of claim 8 wherein the base current comprises negative base current and wherein the BJT is operating in the BJT breakdown region between a common emitter breakdown voltage with the base open (BVCEO) and a common base breakdown voltage with emitter open (BVCBO).

12. An apparatus for producing a compensating base current of an operational BJT operating in an operational circuit to produce an output voltage at an output node and having an operating base current, the apparatus comprising:
- a compensating BJT having substantially similar operating parameters to the operational BJT;
- a first plurality of circuit elements replicating operating conditions of the operational circuit; and
- a second plurality of circuit elements operational with the first plurality of circuit elements and the compensating BJT for producing the compensating base current, wherein the compensating current is supplied to the output node of the operational circuit to compensate the operating base current to allow operation of the BJT in a BJT breakdown region.

13. The apparatus of claim 12 wherein the operating base current comprises negative base current and wherein the operational BJT is operating in the BJT breakdown region between a common emitter breakdown voltage with the base open (BVCEO) and a common base breakdown voltage with emitter open (BVCBO).

14. The apparatus of claim 12 wherein the operating base current flows through a load resistor of the operational circuit, thereby affecting an output voltage of the operational circuit as determined across the load resistor, and wherein the compensating base current removes the effect of the operating base current on the output voltage.

15. The apparatus of claim 12 wherein the operating conditions of the BJT comprise a collector-base voltage and an emitter current of the BJT.

16. The apparatus of claim 12 wherein the compensating current is substantially equal in magnitude to the operating base current.

17. The apparatus of claim 12 wherein the compensating current is fractionally related to the operating base current.

18. The apparatus of claim 12 wherein the operational circuit comprises a BJT operating in a common collector configuration for producing an output voltage for writing data bits to a data storage device.

19. The apparatus of claim 18 wherein the output voltage is supplied to a magnetic transducer for writing the data bits to a magnetic disk of the data storage device.

20. A BJT base current compensation circuit, comprising:
- a BJT having base, collector and emitter regions;
- a first and a second series current path comprising a node therebetween, wherein the base region is connected to the node such that a base current flows through the node;
- a third and a fourth series current path comprising an output node therebetween; an input current flowing on the second and the fourth current paths;
- wherein a combination of the input current and the base current flows on the first current path and is mirrored to the third current path; and
- wherein the current at the output node represents the base current and wherein the current at the output node is supplied to an output node of an operational circuit comprising an operating BJT for compensating a negative base current in the operational circuit to allow operation of the BJT in a BJT breakdown region.

21. The base current compensation circuit of claim 20, wherein the operating BJT is operating in the BJT breakdown region between a common emitter breakdown voltage with the base oven (BVCEO) and a common base breakdown voltage with emitter oven (BVCBO).

22. The base current compensation circuit of claim 20, wherein the BJT operational circuit comprises a first series current path further comprising a load resistor and a first current source and a node therebetween connected to a base terminal of the operating BJT, and comprises a second series current path comprising a collector-emitter path through the BJT, a second current source and an output terminal connected to the emitter terminal, and wherein the current at the output node is supplied to the node connected to the BJT base terminal for compensating the negative bese current.

23. The base current compensation circuit of claim 20, wherein the BJT operational circuit comprises a first series current path further comprising a load resistor and a first current source and anode therebetween connected to a base terminal of the operating BJT, and comprises a second series current path comprising a collector-emitter path through the BJT, a second current source and an output terminal at the emitter terminal, and wherein the current at the output node controls the first current source to compensate the negative base current.

24. A BJT base current compensation circuit for producing a compensating base current comprising:
- a BJT having base, collector and emitter regions;
- a first node connected to the base region, wherein base current flows through the first node;
- an input current flowing from the first node;
- a first MOSFET disposed such that a first current comprising a combination of the input current and the base current flows through a source-drain current path of the first MOSFET;
- a first current mirror with respect to the first MOSFET; and
- a second node connected to the first current mirror, wherein the first current flows through the second node from the first current mirror, and wherein the compensating base current is produced at the second node;
- a current source producing the input current;
- a second MOSFET connected to the current source, wherein the input current flows through a source-drain path of the second MOSFET; and
- a second current mirror with respect to the second MOSFET, wherein the second current mirror is connected to the second node to cause the input current to exit the second node along a second path.

25. The BJT base current compensation circuit of claim 24 wherein the compensating base current at the output node is supplied to a BJT operational circuit for compensating a negative BJT base current in the operational circuit.

26. The base current compensation circuit of claim 25 wherein the BJT is operating between BVCEO and BVCBO.

27. The base current compensation circuit of claim 25 wherein the BJT operational circuit comprises a first series current path further comprising a load resistor and a fltst current source and a node therebetween connected to a BJT base terminal, and comprises a second series current path comprising a collector-emitter path through the BJT, a second current source and an output terminal connected at the emitter terminal, and wherein the compensating base current is supplied to the node connected to the BJT base terminal for compensating the negative base current.

28. The base current compensation circuit of claim 25 wherein the BJT operational circuit comprises a first series current path further comprising a load resistor and a first current source and a node therebetween connected to a BJT base terminal, and comprises a second series current path comprising a collector-emitter path through the BJT, a second current source and an output terminal at the emitter terminal, and wherein the compensating base current controls the first current source to compensate the negative base current.

29. A BJT base current compensation circuit, comprising:
a BJT having a base, a collector and an emitter region, wherein a positive base current Tb is assumed flowing into the base region;
a first and a second reference voltage;
a first MOSFET having a drain-source path connected between the first reference voltage and the collector region and a gate connected to the first reference voltage;
a first node connected to the base region;
a second node;
a resistor connected between the second node and the first reference voltage;
a first current source for producing a current Ipd from the second node to the second reference voltage;
a second current source for producing a current Ie from the emitter region to the second reference voltage;
a second MOSFET having a gate and a source-drain path, wherein the gate is connected to second node;
a first element serially connected to the first reference voltage and to the first node through the drain-source path of the second MOSFET;
a first current mirror operating in conjunction with the first element and connected between an output terminal and the first reference voltage;
a second element;
a third current source for producing a current Tin into the second element;
a second current mirror operating in conjunction with the second element, wherein the second current mirror is disposed to produce the current Tin between the first node and the second reference voltage and between the output terminal and the second reference voltage;
wherein the current flowing through the first element and the source-drain path of the second MOSFET is Iin +Ib;
wherein the current flowing through the first current mirror into the output terminal is Iin +Ib;
wherein the current flowing from the output terminal is substantially Ib.

30. The BJT base current compensation circuit of claim 29 wherein the first and the second elements each comprise a MOSFET.

31. The BJT base current compensation circuit of claim 29 wherein the current flowing from the output terminal is supplied to a BJT operational circuit for compensating a negative base current in the operational circuit.

32. The base current compensation circuit of claim 31 wherein the BJT is operating between BVCEC) and BVCBO.

33. The base current compensation circuit of claim 31 wherein the BJT operational circuit comprises a first series current path further comprising a load resistor and a first current source and a node therebetween connected to a BJT base terminal, and comprises a second series current path comprising a collector-emitter path through the BJT, a second current source and an output terminal connected to the emitter terminal, and wherein the current flowing from the output terminal is supplied to the node connected to the BJT base terminal for compensating the negative base current.

34. The base current compensation circuit of claim 31 wherein the BJT operational circuit comprises a first series current path further comprising a load resistor and a first current source and a node therebetween connected to a BJT base terminal, and comprises a second series current path comprising a collector-emitter path through the BJT, a second current source and an output terminal connected to the emitter terminal, and wherein the current flowing from the output terminal controls the first current source to compensate the negative base current.

35. The apparatus of claim 31 wherein the BJT operational circuit comprises a BJT operating in a common collector configuration for producing an output voltage for writing data bits to a data storage device.

36. The apparatus of claim 35 wherein the output voltage is supplied to a magnetic transducer for writing the data bits to a magnetic disk of the data storage device.

* * * * *